(12) United States Patent
Gordon et al.

(10) Patent No.: US 6,414,313 B1
(45) Date of Patent: *Jul. 2, 2002

(54) MULTIPLE NUMERICAL APERTURE ELECTRON BEAM PROJECTION LITHOGRAPHY SYSTEM

(75) Inventors: Michael S. Gordon, Lincolndale, NY (US); Rodney A. Kendall, Ridgefield; David J. Pinckney, Danbury, both of CT (US)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/323,010

(22) Filed: Jun. 1, 1999

(51) Int. Cl.[7] .................................................. H01J 37/09
(52) U.S. Cl. ..................................... 250/350; 250/452.2
(58) Field of Search ......................... 250/492.2, 492.23, 250/398

(56) References Cited

U.S. PATENT DOCUMENTS

| | | | | |
|---|---|---|---|---|
| 5,334,282 A | * | 8/1994 | Nakayama et al. | 250/492.23 |
| 5,434,424 A | * | 7/1995 | Stickel et al. | 250/492.23 |
| 5,468,969 A | * | 11/1995 | Itoh et al. | 250/492.23 |
| 5,932,884 A | * | 8/1999 | Aizaki | 250/492.23 |
| 6,207,965 B1 | * | 3/2001 | Koike | 250/492.23 |

* cited by examiner

Primary Examiner—Bruce Anderson
(74) Attorney, Agent, or Firm—Whitham, Curtis & Christofferson, P.C.

(57) ABSTRACT

A beam-limiting aperture truncates selected portions of a charged particle beam illuminating portions such as subfields of a patterned reticle of a charged particle beam projection lithography tool and then projects a pattern of charged particles onto a target in a charged particle beam lithography tool. The respective portions of the reticle are patterned in accordance with respective portions of an integrated circuit or other desired pattern and may have differing transmissivities; altering beam current at the target even when source beam current remains substantially constant. The portion of the beam which is truncated, thus altering the particle trajectory semi-angle and numerical aperture of the tool is controlled in accordance with the transmissivity of the reticle portion to enhance resolution to near optimal limits.

24 Claims, 4 Drawing Sheets

LITHOGRAPHY STEP

MULTIPLE NUMERICAL APERTURE ELECTRON BEAM PROJECTION LITHOGRAPHY SYSTEM

BACKGROUND OF THE INVENTION

1. Field of the Invention

The present invention generally relates to high-resolution electron beam systems and, more particularly, to electron beam projection lithography tools having variable beam current.

2. Description of the Prior Art

Many areas of technical endeavor have, in recent years, required increasing levels of dimensional accuracy and resolution. In particular, the field of integrated circuit manufactures has manifested increasing need for increased density of integration and reduced device (e.g. transistors, capacitors, interconnects and the like) dimensions. Reduced device dimensions and increased device proximity provides advantages in both economy of manufacture and level of performance and functionality of integrated circuit chips.

These advantages can readily be appreciated when it is considered that the reduction of size and spacing between devices on a chip allows more devices to be formed on a chip or wafer of given size by the same sequence of process steps having a substantially fixed cost. At the same time, increased proximity of devices reduces signal propagation time and the minimum cycle time of operation of the integrated circuit while reducing susceptibility to electrically coupled noise. Reduced device size also usually requires that the integrated circuit operate at a lower voltage which, while operating margins may be reduced, reduces power dissipation requirements for the chip. The reduced operating margins are of relatively less importance in view of the reduced susceptibility of noise coupling.

While semiconductor manufacturing processes have become very sophisticated and currently provide for production of structures at sizes much smaller than can be directly produced lithographically (e.g. gate sidewalls), at least one lithographic process is invariably required to define the device position and fundamental dimensions. As is well-understood in the art, a lithographic process includes the patterned exposure of a resist so that portions of the resist can be selectively removed to expose underlying areas for selective processing such as by etching, material deposition, implantation and the like. For current designs of integrated circuits, these dimensions have been reduced well below the resolution capability of lithographic processes utilizing radiant energy for selective exposure of the resist.

As an alternative to radiant energy (or, for example, X-Rays, which present other technical problems and/or limitations), charged particle beams have been used for high resolution lithographic resist exposure. In particular, electron beams are particularly favored since the low mass of electrons allows relatively accurate control of an electron beam at relatively low power and relatively high speed. (For this reason, all references to electron beams or electron beam systems hereinafter should be understood as references to a preferred charged particle beam arrangement without exclusion of or limitation as to any form of the latter, more general, class of systems.)

So-called probe-forming systems form a well-focussed spot at the target surface for exposure of the resist. "Gaussian beam" systems, as the name implies, use a spot of Gaussian cross-section and either vector-address or raster-scan the beam to directly write the circuit of interest. Alternatively, shaped-beam systems have higher throughput which is accomplished by parallel pixel exposure. A square shaping aperture is uniformly illuminated and imaged to another aperture, the size of which matches the image of the shaping aperture. The image of the shaping aperture is deflected onto the lower aperture and the compound image is then projected to the target (e.g. wafer). The Gaussian systems project one pixel at a time while the shaped beam systems can expose many pixels in parallel although the number of contiguous pixels concurrently exposed is relatively small.

For example, consider a rectangle of dimensions 0.1×2.0 micrometers. Using a Gaussian beam with a 0.05 micrometer feature size, the rectangle corresponds to forty pixels. A shaped beam system with a maximum spot size of 1.0 micrometer square can expose this rectangle in two exposures.

In general, a single exposure for a shaped-beam system is limited to a few hundred pixels, at most, while the full pattern required for a full integrated circuit may include hundreds of millions of pixels or more. Therefore, the throughput of probe-forming exposure tools, even of the shaped-beam type, is too low to be economically feasible for high density, large scale integrated circuits even though exposures can be made at relatively high speed.

To simultaneously expose much greater numbers of pixels with each exposure, electron beam projection lithography tools have been developed. These tools expose relatively large (e.g. 1 mm square) subfields formed on a reticle which may include an extremely complex pattern. Each subfield can include several million pixels or more and the number of sequential exposures which must be made for each chip is correspondingly reduced. Further, the sub-field image from the reticle is demagnified by the optics of the electron beam column to decrease the feature size and spacing below that produced on the reticle. However, this process and the resulting resist pattern is limited by the ultimate resolution of the electron beam system.

Specifically, a parameter of any charged particle beam column which relates to resolution is the numerical aperture or semi-angle of the particle trajectories of the beam. The beam is typically blanked onto an aperture, referred to as a beam-limiting aperture, at an image of the source cross-over. This aperture is usually smaller than the extent of the beam, causing the beam to be trimmed, and resulting in a beam particle density of Gaussian shape, with the tails truncated, hereinafter referred to as "truncated Gaussian" in shape.

As described in the prior art, electron beam projection lithography systems have a contrast aperture located at the front focal plane of the projection lens. Additionally, this is a plane where an image of the source cross-over occurs, conjugate to the cross-over at the blanking aperture. The width of this truncated Gaussian beam at the plane of the contrast aperture, divided by the focal length of the projector lens yields twice the numerical aperture. The numerical aperture is controlled by the diameter of the beam-limiting aperture.

The resolution of the beam is dependent on many factors including geometric aberrations and Coulomb interactions. Geometric aberrations include chromatic aberrations and spherical aberrations which vary as the numerical aperture to the first and third powers, respectively. The Coulomb interactions have three distinct components: space charge which can be corrected by refocussing the beam of electrons, the Boersch effect which adds energy spread to the beam and contributes to chromatic aberrations, and the stochastic trajectory displacement. The stochastic effect depends on beam energy, length of electron path and numerical aperture as well as beam current.

For a fixed beam column design (length) and beam energy, a trade-off exists between beam current and numerical aperture to balance the effects of the geometric aberrations and the stochastic Coulomb effect. All projection lithography systems to date use a single numerical aperture. This numerical aperture is generally optimized at the maximum target beam current so that the resolution is optimized as well as maximizing the throughput. However, a recent publication by W. Stickel (J. Vac. Sci. Technol., Vol.16(6), November/December, 1998, p. 3211) has analyzed the effect of the stochastic Coulomb interactions on resolution as a function of current, numerical aperture and other parameters. The current dependent loss of resolution varies in the range of about $I^{(0.6)}$–$I^{(0.9)}$ and the numerical aperture dependent loss of resolution varies as $1/NA^{(0.5)}$–$1/NA^{(0.7)}$, depending on the theoretical model and the assumptions used.

However, the target beam current in electron beam projection systems is altered by the transmissivity of the reticle used to expose a pattern in the electron beam. That is, depending on the relative areas of "transparency" (e.g. clear areas on a stencil reticle) the beam current can be attenuated by a particular sub-field mask pattern to any arbitrary degree from 0% to 100%. In general, attenuation will generally vary between 20% and 80% among sub-fields of a reticle for current integrated circuit designs. This variation, although more limited than the theoretically possible variation of beam current still represents a wide variation in beam current and potential degradation of resolution for a single numerical aperture, regardless of how it may be optimized.

In the prior art, to compensate for the space-charge electron interaction effect, the beam had to be refocussed as a function of the transmissivity differences of subfields of the reticle (which cause differences in beam current at the target). The effects of the stochastic interactions are not correctable. However, the optimal numerical aperture which gives the best resolution is dependent on the beam current at the target plane. Using a single numerical aperture to optimize the resolution at high beam current sacrifices some resolution at lower beam currents.

Scanning electron microscopes (SEMs) typically have a series of beam limiting apertures in the column located on a manually-translated apparatus. The apertures are used to define the numerical aperture of the beam in the column which, in turn, controls the geometric aberrations. However, the beam currents are typically too low (in the pA–nA range) for the effect of stochastic Coulomb interactions to affect resolution of the beam.

SUMMARY OF THE INVENTION

It is therefore an object of the present invention to provide an arrangement for substitution of differently sized apertures at a plane of a source crossover in a charged particle beam system.

It is another object of the invention to provide a charged particle beam system capable of using a near-optimum numerical aperture over a wide range of beam currents.

In order to accomplish these and other objects of the invention, methods of enhancing resolution of a charged particle beam lithography and and manufacturing integrated circuits are provided including steps of passing a charged particle beam through a beam-limiting aperture defining a numerical aperture of said charged particle beam projection lithography tool corresponding to a transmissivity of a portion of a reticle, and projecting a pattern of charged particles corresponding to a portion of the reticle onto a target.

In accordance with another aspect of the invention, a charged particle beam projection lithography tool is provided comprising a patterned reticle, and aperture for limiting a semi-angle of particle trajectories of a charged particle beam illuminating a portion of the reticle, and a lens arrangement for projecting a pattern of charged particles corresponding to a portion of the reticle onto a target, wherein the aperture is chosen or otherwise controlled corresponding to a transmissivity of a portion of the patterned reticle.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
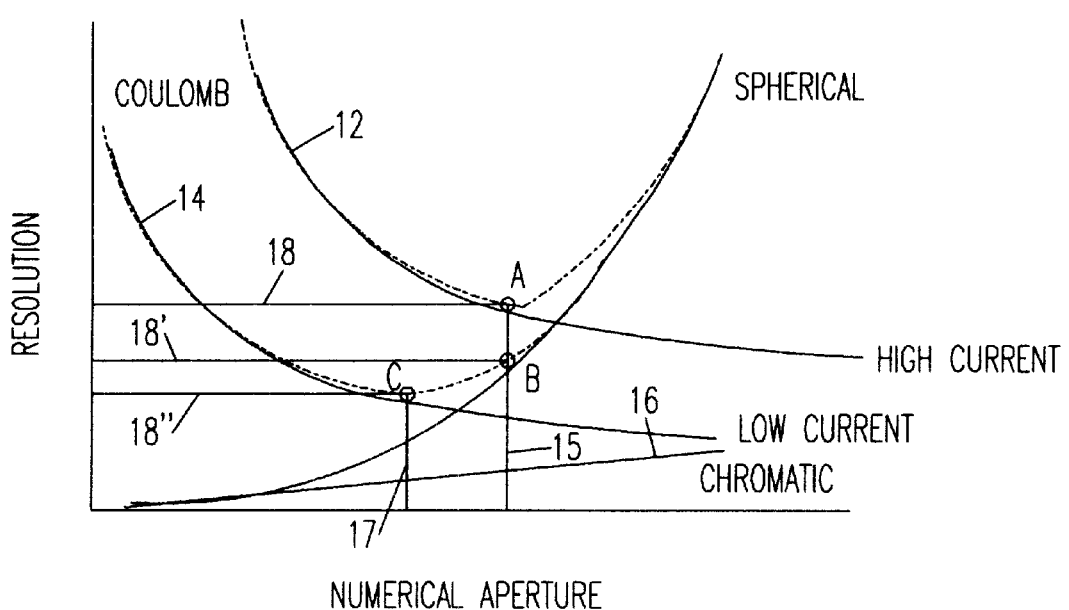
FIG. 1 is a graphical depiction of the variation of dimensional resolution with numerical aperture of an arbitrary charged particle beam system.

Referring now to the drawings, and more particularly to FIG. 1, there is shown a generalized graphical depiction of the dependence of dimensional resolution on numerical aperture in a charged particle lithography tool for different beam currents. Since the depiction is generalized, no numerical values are indicated on the orthogonal axes. It should also be understood that the term "resolution" refers to the dimensions of a feature which the system can resolve. Thus, the positive direction along the vertical axis of the graph of FIG. 1 represents an increased dimension that can be resolved; corresponding to a resolution value which would be described in some instances as being "lower" or "reduced" resolution. In other words, the optimum resolution for each beam current is represented as a minimum in a respective curve 12, 14 corresponding to a given column configuration. The spherical and chromatic aberration coefficients are fixed for a given charged particle beam column configuration; the optimal numerical aperture (NA) is then a function only of target beam current.

It should be noted that the chromatic aberrations are dependent on the first power of numerical aperture and its contribution of chromatic aberrations to reduction of resolution of an arbitrary charged particle beam system is depicted as line 16. This contribution thus lies below the minimum of a curve (e.g. 12, 14) corresponding to a particular current and represents a limit on resolution of the system. In regard to the other contributions to degradation of resolution, at low numerical apertures, spherical aberrations become negligible and the limit on resolution is dominated by Coulomb interactions which vary with current. Conversely, at high numerical apertures, spherical aberrations dominate and curves 12 and 14 converge. This convergence might suggest an operational numerical aperture, however, the resolution at this value of the numerical aperture produces an unacceptably poor resolution which is much worse than that obtained at the minimum of curves 12 or 14.

It can also be observed from the curves 12, of FIG. 1 that the optimum NA varies with beam current. That is, for different beam currents, the dimensional resolution curve will exhibit a minimum at a different respective NA, as indicated, for example, at 15, 17. It can be seen from FIG. 1 that if the numerical aperture is optimized for a system operating at a large beam current (position a, line 12), and the beam current is lowered (with the beam refocussed to compensate for the change in the space-charge component of the electron interactions) the column would be operating at position b of curve 14. As shown in FIG. 1, position b is an operational point on curve 14 that is not at the optimal numerical aperture. The resolution corresponding to point b on curve 14 is shown by line 18'. The optimal numerical aperture at this lower beam current is shown by point c on curve 14 and would produce better resolution as shown by line 18". The optimal numerical aperture at high and low beam current is shown by 15, 17, respectively. While the difference in resolution between points b and c appears relatively small in comparison with the improvement in decreasing the beam current (and refocussing), it must be recalled that FIG. 1 represents idealized limits on the system resolution.

Thus, the alteration of numerical aperture of a charged particle beam tool to at least approximate an optimized numerical aperture for a given beam current or a plurality of beam currents represents an improvement in resolution which has not heretofore been realized in a practical system, particularly a charged particle beam projection system in which beam current will vary with the transmissivity of reticle sub-fields which must, as a practical matter, be exposed in rapid succession. The improved resolution thus supports additional increases in integration density and reduction in individual device size which, in turn, supports improved performance and functionality of chips as well as significant economies of manufacture.

In order to alter numerical aperture rapidly and without significant interruption of operation of the electron beam projection exposure tool, it is necessary to change the size of the aperture at an image of the source cross-over. It is envisioned that the charged particle beam projection system will expose a complete wafer or lot of wafers at a given, single, beam current impinging on the reticle. However, the beam current impinging on the reticle could also be changed between wafers or wafer lots and the system recalibrated as needed. As discussed above, the beam current impinging on the wafer is modulated by the transmissivity of subfields on the reticle. The numerical aperture would preferably be changed when the beam current impinging on the reticle is changed, to a value corresponding to the optimal resolution for a large transmissivity subfield (e.g. in the range of 0.75–0.90).

It would take an unacceptably large amount of down-time to stop operation of the system, and vent the system to replace the beam-defining aperture to provide the optimum numerical aperture for a new desired beam current. Therefore, it is envisioned that the numerical aperture would be changed within the vacuum in conjunction with a beam current change. It is unlikely that a mechanical mechanism could be made to operate in such a fashion on a subfield-by-subfield basis, but those skilled in the art will appreciate that if such a fast mechanism were available for numerical aperture adjustment, then the numerical aperture could be changed on a subfield-by-subfield basis since the exposure rate of charged particle beam projection is very high at the present state of the art. However, mechanisms presently available could switch numerical aperture a small to moderate number of times for each chip without significantly diminishing throughput and exposures made in order of groupings of reticle subfields with similar transmissivity.

In FIGS. 2–5, discussed below, the actual numerical apertures to which different beam-limiting apertures correspond is only critical to the practice of the invention by being chosen to give good coverage of the anticipated range of beam currents and reticle transparencies. Some of the actual aperture sizes chosen may be very similar to each other and very different from others to optimize overall performance in regard to a particular distribution of beam currents selected to impinge on the reticle and a particular distribution of beam transparencies.

Mechanical irises are not reliably operated and have an increased tendency to bind in high vacuum environments. Binding is particularly unacceptable since it would radically change the shape and, more importantly, position of the aperture as well as providing an incorrect size of aperture. It is important that the position of the aperture center relative to the beam remain constant and a servo arrangement which is known in probe forming systems can be provided to allow fine adjustment of the location of the beam with respect to any aperture in any of the structures shown in FIGS. 2–5 and is indicated by arrows 100 therein such that the beam will be properly incident on the selected aperture.

Figure 2:
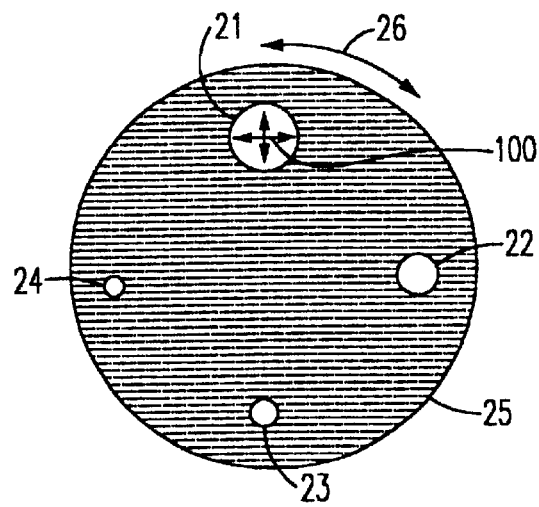
FIGS. 2, 3, 4 and 5 are alternative structures to provide different charged particle source apertures to approximate the optimum numerical aperture over a range of beam currents.

Accordingly, a first preferred form of variable beam-limiting aperture corresponding to a plurality of discrete numerical apertures is shown in FIG. 2 in which a plurality of differently sized apertures 21, 22, 23, 24 are provided in a rotatable disk. A desired number of apertures of differing diameters are provided at preferably equal angular spacings along a circular locus on disk 25, coaxial with an axis of rotation of the disk. An indexing arrangement, preferably including a position transducer and decoder and which is schematically represented by arrow 26, should be capable of assuring that the center of each aperture is brought, within a very small tolerance, to the same position when the disk is rotated to alter the numerical aperture. An alignment servo would be employed as is implemented on probe-forming shaped-beam systems to align the beam to the aperture when a different aperture is selected.

Figure 3:
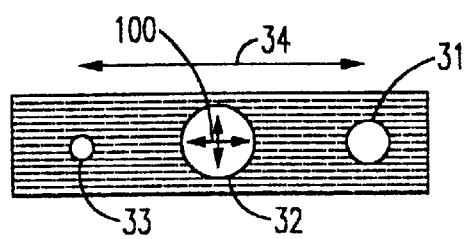

A second preferred form of the invention is shown in FIG. 3 and is generally similar to the arrangement of FIG. 2 except that the apertures 31, 32 and 33 are arranged along a linear locus and are preferably equally spaced on centers therealong. Any number of apertures can be provided, as desired. The indexing arrangement, schematically indicated by arrow 34 again preferably includes a position transducer and decoder and should be capable of bringing each aperture selectively to the same location within a very small tolerance.

Figure 4:
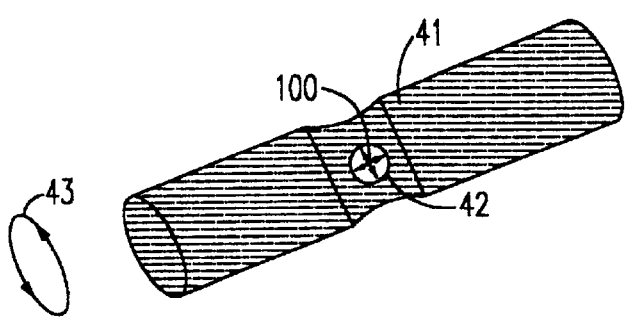

A third preferred embodiment is illustrated in a somewhat simplified form in FIG. 4. In this case, the apertures 41, 42 are provided in an intersecting manner orthogonally to the axis of rotation of a cylinder under control of a suitable indexing arrangement schematically indicated by arrows 43. The body of the cylinder has the advantage relative to the embodiments of FIGS. 2 and 3 of high structural robustness and high current carrying capability while being relatively more straightforward to prevent escape of electrons other than as part of the beam.

Figure 5:
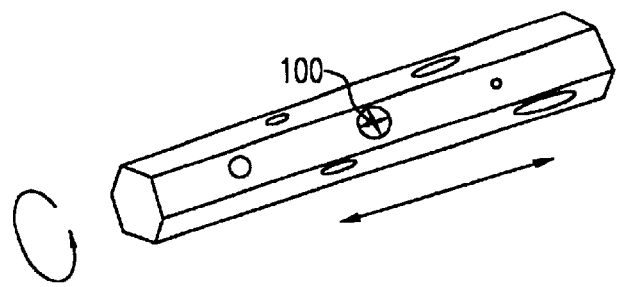

A fourth preferred embodiment is shown in FIG. 5. It will be recognized from the foregoing that the embodiment of FIG. 5 is, conceptually, a combination of the embodiments of FIGS. 3 and 4. Specifically, apertures are provided in respective faces of a polygonal prism which is arranged to be both axially rotated and axilly shifted in order to present an aperture of the desired size to appropriately truncate the beam for substantially optimum resolution. While this embodiment requires more complex motion (e.g. rotational and/or linear) to align a selected aperture with the beam, more differently sized apertures can be provided.

Figure 6A:
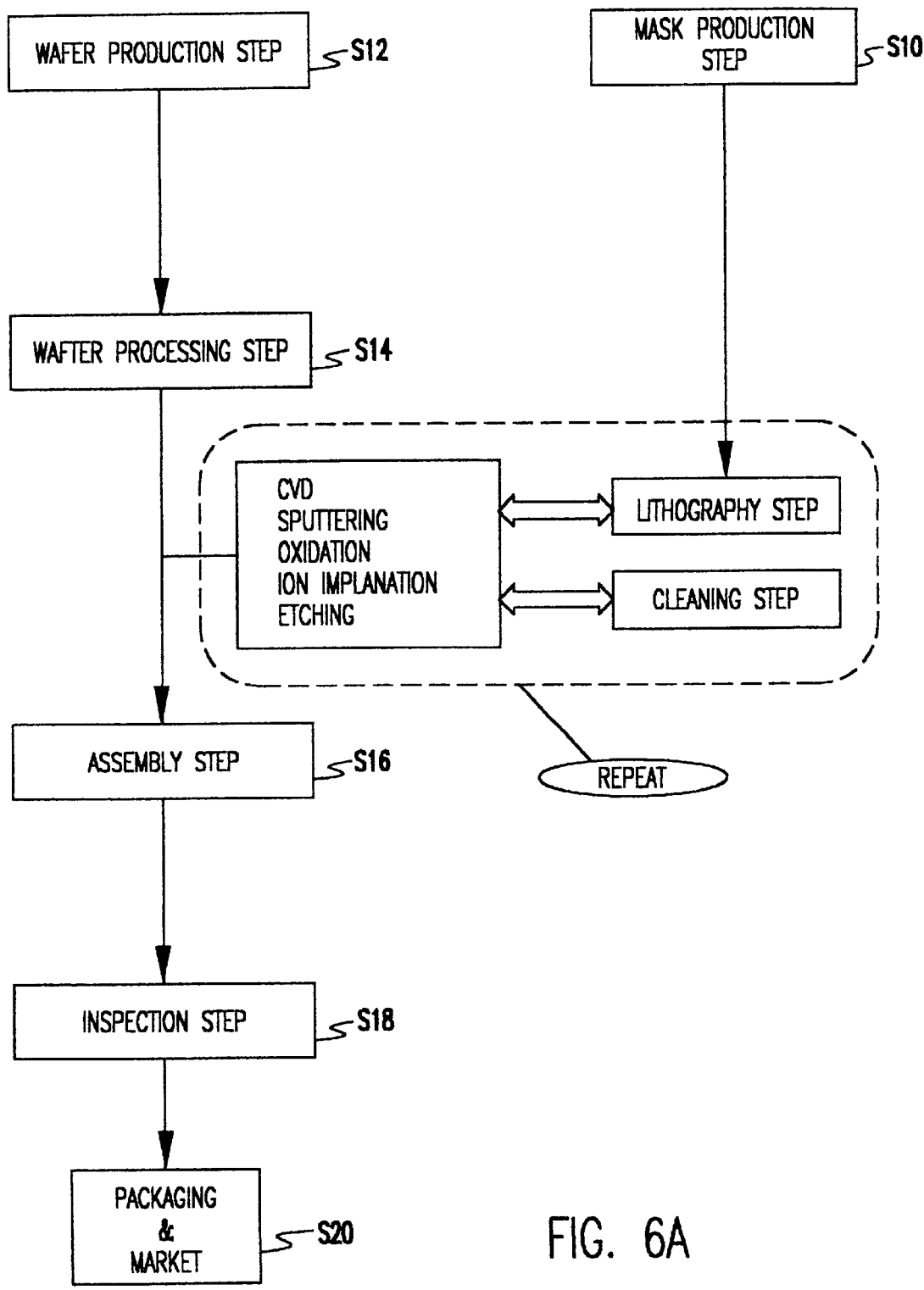
FIGS. 6A and 6B illustrate a generalized intergrated circuit manufacturing process including the invention.

FIG. 6A shows a generalized flow diagram providing an overview of the fabrication process for a semiconductor device (or apparatus) utilizing the invention. It is well understood by one of ordinary skill in the art that FIG. 6A may equally represent a high level block diagram of a fabrication process of a semiconductor device. It is also well understood that the high level block diagram represents a preferred although generalized fabrication method and that other fabrication methods may be equally used with the present invention. Details of particular fabrication methods are unimportant to the practice of the invention; however, at least one lithographic exposure is invariably required to determine device locations and dimensions. When the lithographic process is carried out in accordance with the invention described above, more accurately defined patterns can be achieved consistent with high throughput in manufacture of integrated circuits of increased functionality and improved performance, which are not otherwise produceable with other currently known lithographic techniques that do not include utilization of the invention.

Referring now to FIG. 6A, the semiconductor device fabrication begins with a mask fabrication at step S10. The mask fabrication comprises patterning a mask by known methods such as, for example, resist coating, electron beam exposure, development, etching, resist stripping and the like. Upon completion of the mask fabrication, the mask is inspected and corrections to the mask are made, if necessary. In order to correct any defects that may be present in the mask, the patterning of the mask would again be performed subsequent to inspection. The finished mask (or reticle) is then used for wafer processing at step S14.

Wafer fabrication typically comprises growing a single crystal and performing mechanical processes on the grown crystal. These mechanical processes may include, for example, slicing or cutting a wafer and rounding the edges. The wafer is then polished and well known thermal processing is performed thereon as may be desired, for example, to getter impurities and or contaminants, repair crystal damage or the like. Thereafter, the wafer is inspected for defects.

Once the wafer is fabricated and only a predetermined small amount of tolerable defects are found, wafer processing begins at step S14. Wafer processing includes providing a thin film on a wafer for providing a circuit element. The thin film may be formed on the wafer by, for example, evaporation or sputtering deposition, CVD (chemical vapor deposition), ion implantation and the like depending on the intended material of the film. Once the thin film is deposited on the wafer, modification to the thin film is performed in order to provide the thin film with certain defined electrical properties, if necessary. The modification of the thin film may include, for example, etching to form circuit patterns, oxidation to form an insulator or doping to control conductivity. Doping may be performed by any well known method such as ion implantation, thermal diffusion, deposition of a doped film and the like.

It is well understood by one skilled in the art, that the wafer may be washed after the wafer process (e.g., etching, deposition, implantation and the like). It is also understood that several processing steps, such as, for example, two or more CVD processing steps or the like may be performed, and that the washing of the wafer may be performed between each of these individual processing steps, if desired. The washing and processing of the wafer may be repeated any number of times, and is limited only by the intended use of the finished device.

The thin film is patterned using the mask fabricated in step S10. The patterning of the thin film includes exposing the resist layer, via a lithographic process (e.g., charged particle exposure), to form a latent image on the resist. The charged particle exposure is discussed in detail with reference to FIG. 6B. It is further well understood that the charged particle exposure selectively modifies the resist in a predetermined pattern by altering the chemical composition of the resist. The resist is then developed to form a pattern in accordance with the exposure and inspected for any defects.

After inspection, the wafer is baked to stabilize the resist pattern, and after the desired processing (e.g., etching, deposition, implantation and the like), the resist may be stripped and the wafer washed, if necessary.

The charged particle exposure associated with step S14 may be repeated any number of times in order to provide numerous thin film layers having certain defined electrical properties in patterned areas of each such layer. Moreover, the wafer may be washed after each individual charged particle exposure process. Depending on the specific application, the wafer may then be coated with an insulative layer and provided with a contact hole (e.g., through hole).

In step S16, the patterned wafer is assembled into a device. This process includes testing, inspecting and dicing the wafer, and providing bonding to the chips diced from the wafer. Bonding includes connecting a lead wire for connection to an electrode, semiconductor device or other component. The assembled semiconductor chip is then packaged (e.g., sealed) to stabilize the semiconductor chip and inspected for any defects. In step S18, the assembled semiconductor chip is inspected and tested, and introduced into the marketplace in step S20.

Figure 6B:
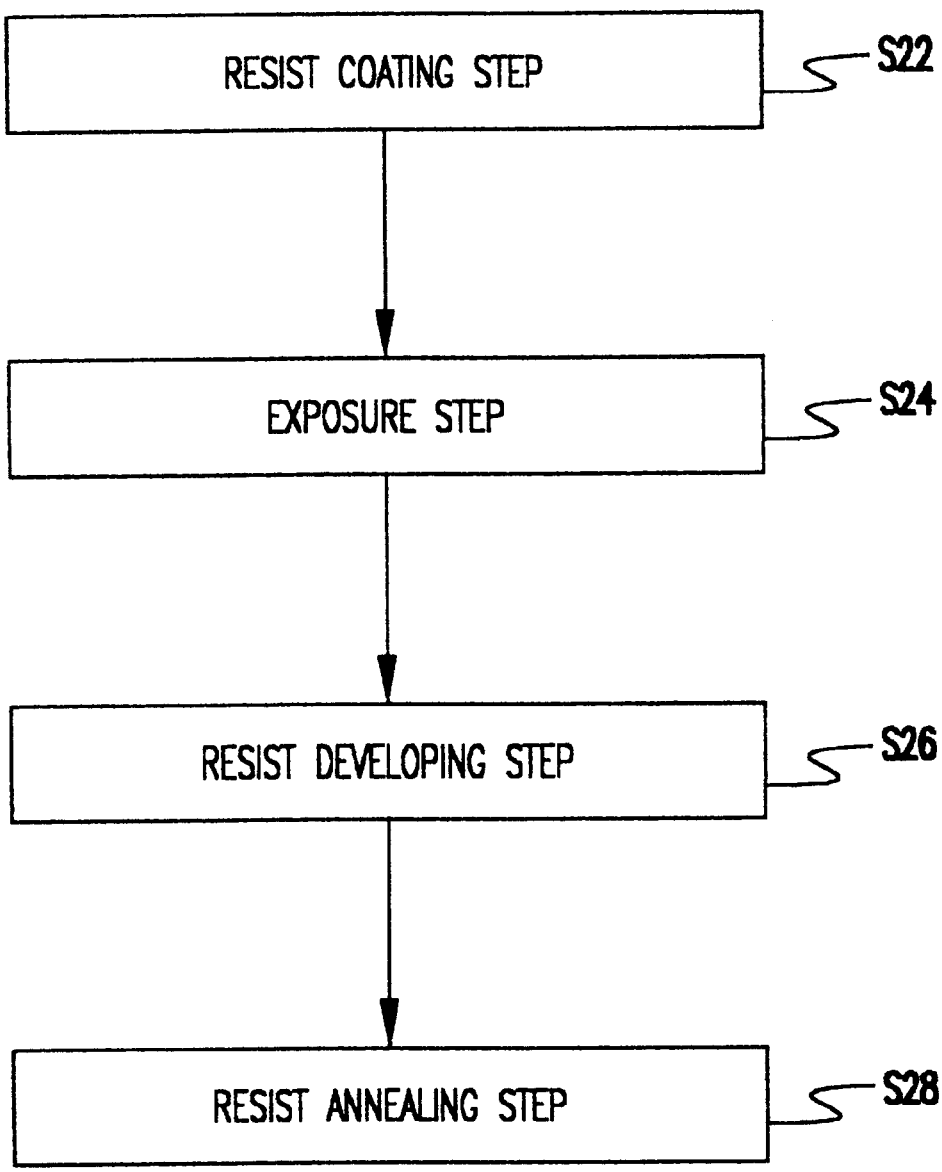

FIG. 6B shows the detailed process of resist pattern formation as shown with relation to the resist pattern formation of step S14 of FIG. 6A. As is well understood by those of ordinary skill in the art, the lithographic process of steps S22–S26 is invariably included to define latent images on the resist, and that the accuracy of patterning of the resist is critical to the overall design and manufacture of the device regardless of the technology that may be used to develop such latent images on the resist since the location and basic dimensions of electron elements and conductors are established thereby. To this end, at step S22, the step of resist coating is shown. At step S24, the resist is exposed to electron means utilizing the mask formed in step S10 of FIG. 6A. This exposure is performed, for example, by an electron beam stepper device.

As discussed above in connection with FIG. 1, use of the invention during exposure of the resist allows the numerical aperture to be substantially optimized to produce enhanced resolution for various ranges of beam current and/or reticle transparency to provide improved fidelity of the latent image to sub-fields of the reticle. Since the numerical aperture can be changed without significantly interrupting the sequence of sub-field exposures or modification of the tool, throughput is enhanced and problems of registration are avoided while substantially maximum resolution is achieved.

At step S26, the resist is developed to form a pattern in accordance with the exposure of step S24. At step S26, the resist is then annealed. Once such a pattern is formed, the semiconductor fabrication process continues as described above.

In view of the foregoing, it is seen that the invention provides a significant increase and uniformity of dimensional resolution in an electron beam tool in which the beam current may vary by providing a beam-limiting aperture which presents a numerical aperture approximating an optimal numerical aperture for different beam currents, as those beam currents may be altered, for example, by sub-fields of differing transmissivity in a projection reticle. By doing so, more nearly optimal performance, particularly of an electron beam projection lithography tool, is realized than has heretofore been achieved.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of enhancing resolution of a charged particle beam projection lithography tool comprising the steps of
    passing a charged particle beam through a beam-limiting aperture, said beam-limiting aperture located at a cross-over point of a source image defining a selected semi-angle of particle trajectories of said charged particle beam projection lithography tool corresponding to one of a transmissivity of a portion of a reticle and a change of beam current at a target, and
    projecting a pattern of charged particles corresponding to said portion of said reticle onto said target.

2. A method as recited in claim 1, wherein said charged particle beam projection lithography tool is an electron beam projection lithography tool.

3. A method as recited in claim 1, including the further step of
    selecting a beam limiting aperture which defines a numerical aperture corresponding to a transmissivity of said portion of said reticle.

4. A method as recited in claim 3, including the further step of
    moving a structure having a plurality of beam-limiting apertures therein such that a beam of charged particles is limited in particle trajectory semi-angle by one of said beam-limiting apertures.

5. A method as recited in claim 4, wherein said structure is a plate and said moving step includes axial rotation of said plate.

6. A method as recited in claim 4, wherein said structure is a plate and said moving step includes linear movement of said plate.

7. A method as recited in claim 4, wherein said structure is cylindrical and said moving step includes axial rotation of said cylindrical structure.

8. A method as recited in claim 4, wherein said structure is in the form of a prism and said moving step includes one of axial rotation and axial shifting of said prism structure.

9. A method of manufacturing an integrated circuit by charged particle beam projection lithography comprising the steps of
    passing a charged particle beam through a beam-limiting aperture, located at a cross-over point of a source image said beam-limiting aperture defining a selected semi-angle of particle trajectories of said charged particle beam projection lithography tool corresponding to one of a transmissivity of a portion of a reticle patterned in accordance with said integrated circuit and a change of beam current at a target, and
    projecting a pattern of charged particles corresponding to said portion of said reticle onto a wafer.

10. A method as recited in claim 9, wherein said charged particle beam projection lithography tool is an electron beam projection lithography tool.

11. A method as recited in claim 9, including the further step of
    selecting a beam limiting aperture which defines a numerical aperture corresponding to a transmissivity of said portion of said reticle.

12. A method as recited in claim 11, including the further step of
    moving a structure having a plurality of beam-limiting apertures therein such that a beam of charged particles is limited in particle trajectory semi-angle by one of said beam-limiting apertures.

13. A method as recited in claim 12, wherein said structure is a plate and said moving step includes axial rotation of said plate.

14. A method as recited in claim 12, wherein said structure is a plate and said moving step includes linear movement of said plate.

15. A method as recited in claim 2, wherein said structure is cylindrical and said moving step includes axial rotation of said cylindrical structure.

16. A method as recited in claim 12, wherein said structure is in the form of a prism and said moving step includes one of axial rotation and axial shifting of said prism structure.

17. A charged particle beam projection lithography tool comprising
    a patterned reticle,
    means for limiting a semi-angle of particle trajectories of a charged particle beam being located at a cross-over point of a source image and illuminating a portion of said reticle, and
    means for projecting a pattern of said charged particles corresponding to said portion of said reticle onto a target, wherein
    said means for limiting said semi-angle of particle trajectories includes means for truncating a portion of said charged particle beam corresponding to one of a transmissivity of a portion of said patterned reticle and a change of beam current at said target.

18. A charged particle beam lithography tool as recited in claim 17, wherein said charged particle beam is an electron beam.

19. A charged particle beam lithography tool as recited in claim 17, wherein said means for truncating a portion of said charged particle beam includes
    a structure having a plurality of apertures formed therein.

20. A charged particle beam lithography tool as recited in claim 19, wherein said structure in an axially rotatable plate.

21. A charged particle beam lithography tool as recited in claim 19, wherein said structure in a translatable plate.

22. A charged particle beam lithography tool as recited in claim 19, wherein said structure in an axially rotatable cylinder.

23. A charged particle beam lithography tool as recited in claim 19, wherein said structure in an axially rotatable and shiftable prism.

24. A charged particle beam projection lithography tool comprising
    a patterned reticle,
    means, including an beam aperture located at a cross-over point of a source image, for selectively limiting a semi-angle of particle trajectories of a charged particle beam illuminating a portion of said reticle corresponding one of to a transmissivity of said portion of said patterned reticle and a change of beam current at a target, and
    means for projecting a pattern of said charged particles corresponding to said portion of said reticle onto said target, and
    an alignment servo to align the beam to said aperture when said aperture is changed by said means for selectively limiting a semi-angle of particle trajectories.

* * * * *